(12) United States Patent
Kim et al.

(10) Patent No.: US 9,130,192 B2
(45) Date of Patent: Sep. 8, 2015

(54) ORGANIC LIGHT EMITTING DIODE DISPLAY AND MANUFACTURING METHOD THEREOF

(71) Applicant: Samsung Display Co., Ltd., Yongin, Gyeonggi-Do (KR)

(72) Inventors: Sang Woo Kim, Cheonan-si (KR); Soon Ryong Park, Sejong-si (KR); Ju Yeop Seong, Cheonan-si (KR); Yong Hoon Chun, Cheonan-si (KR); Chul Woo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/224,000

(22) Filed: Mar. 24, 2014

(65) Prior Publication Data

US 2015/0102296 A1    Apr. 16, 2015

(30) Foreign Application Priority Data

Oct. 15, 2013 (KR) .......................... 10-2013-0122824

(51) Int. Cl.
| | | |
|---|---|---|
| H01L 35/24 | (2006.01) | |
| H01L 51/52 | (2006.01) | |
| H01L 51/56 | (2006.01) | |
| H01L 27/32 | (2006.01) | |

(52) U.S. Cl.
CPC ............ *H01L 51/5253* (2013.01); *H01L 27/32* (2013.01); *H01L 51/56* (2013.01)

(58) Field of Classification Search
CPC .................................................. H01L 51/5253
USPC ............................................. 257/40, E51.001
See application file for complete search history.

(56) References Cited

U.S. PATENT DOCUMENTS

| 8,358,066 B1 * | 1/2013 | Aurongzeb ................... 313/512 |
|---|---|---|
| 8,408,775 B1 * | 4/2013 | Coleman ....................... 362/615 |
| 2009/0015142 A1 | 1/2009 | Potts et al. |

FOREIGN PATENT DOCUMENTS

| JP | 3942039 B2 | 4/2007 |
|---|---|---|
| KR | 100967362 B1 | 6/2010 |
| KR | 10-2014-0136762 | 12/2014 |

* cited by examiner

*Primary Examiner* — Anthony Ho
(74) *Attorney, Agent, or Firm* — Christie, Parker & Hale, LLP

(57) ABSTRACT

A organic light emitting diode display including an organic light emitting display panel displaying an image, and a lower passivation film attached to a bottom of the organic light emitting panel and including a polymer resin and an antistatic agent, wherein the lower passivation film includes a plurality of stress adjustment patterns disposed to be adjacent to each other wherein decreasing the bending interval between the bending stress adjustment patterns formed at the lower passivation film processed with the antistatic agent and attached at the position corresponding to the bending portion of the organic light emitting panel, thereby selectively minimizes the stress of the bending portion of the organic light emitting panel, therefore, asymmetry of strains of the bending portions of the organic light emitting display panel can be prevented to remove a picture abnormality, and static electricity may be prevented.

14 Claims, 8 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2013-0122824 filed in the Korean Intellectual Property Office on Oct. 15, 2013, the entire contents of which are incorporated herein by reference.

BACKGROUND

1. Field

The present invention relates to an organic light emitting diode display and a manufacturing method thereof.

2. Description of the Related Art

An organic light emitting diode (OLED) display includes a plurality of OLEDs formed of a hole injection electrode, an organic emission layer, and an electron injection electrode. Each organic light emitting diode emits light by energy generated when excitons generated as electrons and holes are combined and drop from an excited state to a ground state, and the OLED display displays an image by using the light.

The organic light emitting element may be deteriorated by external factors such as external moisture, oxygen, or ultraviolet rays (UV) so packaging methods for encapsulating the organic light emitting element are important, and the organic light emitting diode (OLED) display is required to be manufactured thin or flexible for various types of applications. In order to encapsulate the organic light emitting element and form a thin organic light emitting diode (OLED) display and bend it, a thin film encapsulation (TFE) method has been developed. In the thin film encapsulation method, a display area is covered with a thin film encapsulation layer by alternately stacking an inorganic layer and an organic layer over the organic light emitting elements that are formed in the display area of the display substrate. When the display substrate of the organic light emitting diode (OLED) display including the thin film encapsulation layer is formed with a flexible film such as polyimide (PI), it can be easily bent and advantageously be made slim.

When the flexible organic light emitting diode display is bent, stress occurs. Specifically, tensile stress occurs on a convex outside surface and compressive stress occurs on a concave inside surface. A neutral plane NP at which no force occurs is present in an intermediate region between the outside and the inside surfaces. A picture abnormality does not occur in the organic light emitting diode display only when the organic light emitting element is positioned in the neutral plane.

However, when the thickness of the organic light emitting diode display is increased because of additional internal and external films such as a polarizing film and a passivation film attached to the organic light emitting diode display, the tensile stress and the compressive stress are increased and the neutral plane becomes narrow. Accordingly, it is difficult to position the organic light emitting element in the neutral plane. Further, since the organic light emitting diode display has a layered structure made of complex materials, asymmetry of strains occur due to a difference in tensile stress and compressive stress of the outside surface and the inside surface of a bent bending portion. Accordingly, it is difficult to position the organic light emitting element in the neutral plane, and thus picture abnormality occurs.

The above information disclosed in this Background section is only for enhancement of an understanding of the background of the invention and therefore it may contain information that does not form prior art that is already known to a person of ordinary skill in the art.

SUMMARY

Some embodiments of the present invention has been made in an effort to provide an organic light emitting diode display selectively adjusting a strain of a bending portion to reduce stress of the bending portion and preventing static electricity through an antistatic agent, and a method of manufacturing the same.

According to an exemplary embodiment of the present invention, an organic light emitting diode display includes an organic light emitting display panel displaying an image, and a lower passivation film attached to a bottom of the organic light emitting panel and including a polymer resin and an antistatic agent, wherein the lower passivation film includes a plurality of stress adjustment patterns disposed to be adjacent to each other.

The polymer resin may include at least one selected from a group including a UV epoxy-based material, a urethane acrylate-based material, and an acrylate-based material.

The antistatic agent may include at least one selected from a group including a conductive polymer, carbon black, a metal powder, a metal salt, carbon nanotubes, and graphene.

The antistatic agent may be in a range of about 2% to 10% by weight with regard to a total weight of the polymer resin and the antistatic agent.

The lower passivation film may further include an inorganic fiber material.

The inorganic fiber material may be in a range of about 20% to 40% by weight with regard to a total weight of the polymer resin, the antistatic agent, and the inorganic fiber material.

The stress adjustment pattern may have a shape that is one selected from a triangle shape, trapezoid shape, and a semicircle shape.

Ends of the stress adjustment patterns adjacent to each other may be directly connected.

Ends of the stress adjustment patterns adjacent to each other may be separated and connected.

The organic light emitting panel may include a flat plane portion and a bending portion positioned at both ends of the plane portion and may be bent.

The stress adjustment pattern may include a plane stress adjustment pattern formed at a position corresponding to the plane portion and a bending stress adjustment pattern formed at a position corresponding to the bending portion, and a bending interval between the bending stress adjustment patterns may be smaller than a plane interval between the plane stress adjustment patterns.

The bending interval or the plane interval may be an interval between center axes of upper ends of the stress adjustment patterns.

The lower passivation film may be formed under the plane portion, and further includes a plane protection portion adjacent to the stress adjustment pattern.

The plane protection portion may be formed at a position corresponding to the plane portion.

The organic light emitting panel may include a flexible substrate attached to the lower passivation film, an organic light emitting element formed on the flexible substrate, and a thin film encapsulation layer covering the organic light emitting element.

A manufacturing method of an organic light emitting diode display includes: manufacturing a lower passivation film including a polymer resin and an antistatic agent and including a plurality of stress adjustment patterns disposed to be adjacent to each other; attaching the lower passivation film under a flexible substrate; sequentially forming an organic light emitting element and a thin film encapsulation layer on the flexible substrate to complete an organic light emitting panel; separating a release film from the lower passivation film to expose the stress adjustment patterns; and bending a portion of the organic light emitting panel to form a bending portion.

The organic light emitting diode display according to an exemplary embodiment of the present invention decreases the bending interval between the bending stress adjustment patterns formed at the lower passivation film processed with the antistatic agent and attached at the position corresponding to the bending portion of the organic light emitting panel, thereby selectively minimizing the stress of the bending portion of the organic light emitting panel. Therefore, asymmetry of strains of the bending portions of the organic light emitting display panel can be prevented to remove a picture abnormality, and static electricity may be prevented.

Further, a stress adjustment layer is covered with a release film to flatten the lower passivation film while the stress adjustment pattern of the lower passivation film is not first exposed, thus completing the organic light emitting display panel. Thereby, it is possible to prevent a reduction in recognition ratio of an alignment mark due to optical scattering by the stress adjustment patterns of a lower passivation film during a manufacturing process.

Further, when a chip on film (COF) is pressed on the organic light emitting display panel while the stress adjustment pattern of the lower passivation film is exposed, pressing force may be reduced to increase a frequency of occurrence of pressing defects. However, it is possible to prevent a reduction in pressing force and reduce a frequency of occurrence of pressing defects by pressing the chip on film (COF) on the organic light emitting display panel while the stress adjustment pattern is covered with the release film to flatten the lower passivation film.

DETAILED DESCRIPTION

Figure 1:
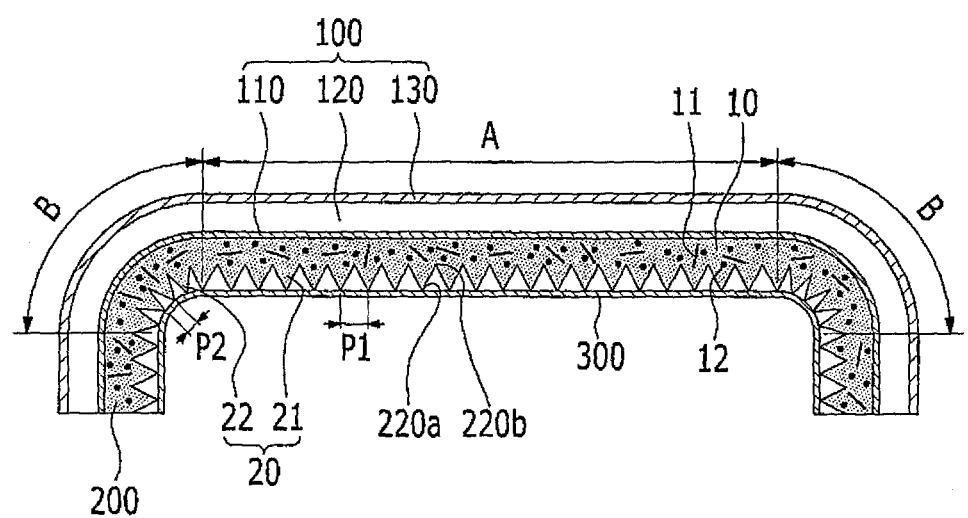
FIG. 1 is a lateral view of an organic light emitting diode display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an organic light emitting diode display according to a first exemplary embodiment of the present invention will be described in detail with reference to FIG. 1 and FIG. 2.

Figure 2:
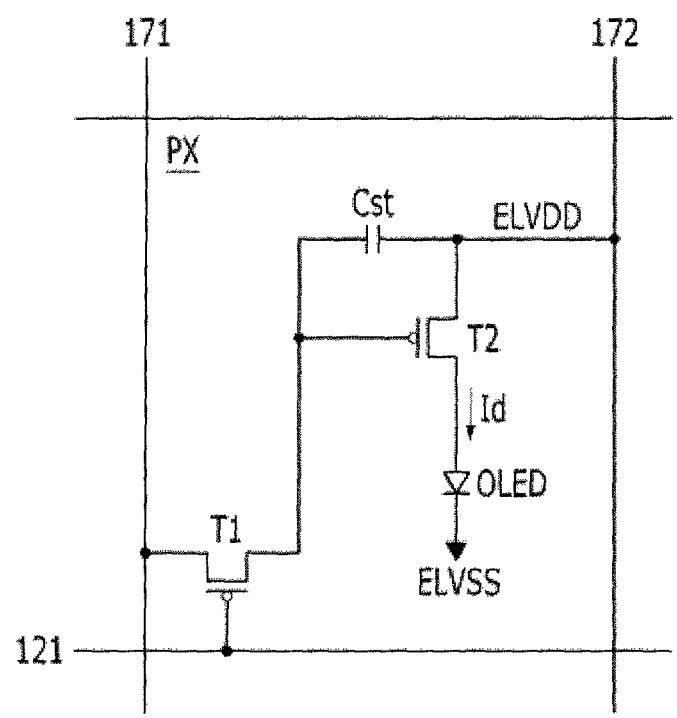
FIG. 2 is an equivalent circuit of one pixel of the organic light emitting diode display according to the first exemplary embodiment of the present invention.

FIG. 1 is a lateral view of an organic light emitting diode display according to a first exemplary embodiment of the present invention, and FIG. 2 is an equivalent circuit of one pixel of an organic light emitting element of the organic light emitting diode display according to the first exemplary embodiment of the present invention.

As shown in FIG. 1, the organic light emitting diode display according to the first exemplary embodiment of the present invention includes an organic light emitting display panel 100 displaying an image, and a lower passivation film 200 attached to the bottom of the organic light emitting display panel 100.

The organic light emitting display panel 100 includes a flexible substrate 110, an organic light emitting element 120 formed on the flexible substrate 110, and a thin film encapsulation layer 130 covering the organic light emitting element 120. The organic light emitting display panel 100 may be divided into a flat plane portion A, and bending portions B positioned at respective ends of the plane portion A which are bent.

The flexible substrate 110 may be formed of a flexible film such as a polyimide.

As shown in FIG. 2, the organic light emitting element 120 includes a plurality of signal lines 121, 171, and 172, and a plurality of pixels PX connected thereto and arranged in an approximate matrix form.

The signal lines include a plurality of scan lines 121 transferring a scan signal (or gate signal), a plurality of data lines 171 transferring a data signal, and a plurality of driving voltage lines 172 transferring a driving voltage ELVDD. The scan lines 121 extend in an approximate row direction and are almost parallel to each other, and the data lines 171 and the driving voltage lines 172 extend in an approximate column direction and are almost parallel to each other. Each pixel PX includes a switching thin film transistor TR1, a driving thin film transistor T2, a storage capacitor Cst, and an organic light emitting diode (OLED).

The switching thin film transistor TR1 has a control terminal, an input terminal, and an output terminal. The control terminal is connected to the scan line 121, the input terminal is connected to the data line 171, and the output terminal is connected to the driving thin film transistor T2. The switching thin film transistor TR1 transfers the data signal applied to the data line 171 to the driving thin film transistor T2 in responses to the scan signal applied to the scan line 121.

Further, the driving thin film transistor T2 has a control terminal, an input terminal, and an output terminal. The control terminal is connected to the switching thin film transistor TR1, the input terminal is connected to the driving voltage line 172, and the output terminal is connected to the organic light emitting diode (OLED). The driving thin film transistor T2 allows an output current Id having a varying level according to a voltage applied between the control terminal and the output terminal to flow.

The storage capacitor Cst is connected to the control terminal and the input terminal of the driving thin film transistor T2 between the control terminal and the input terminal. This storage capacitor Cst charges the data signal applied to the control terminal of the driving thin film transistor T2 and maintains the data signal even after the switching thin film transistor TR1 is turned off.

The organic light emitting diode (OLED) has an anode connected to the output terminal of the driving thin film transistor T2, a cathode connected to a common voltage ELVSS, and an organic light emitting member formed between the anode and the cathode. The organic light emitting diode (OLED) displays an image by emitting light while the intensity is changed according to the output current Id of the driving thin film transistor T2.

The switching thin film transistor TR1 and the driving thin film transistor T2 may be n-channel field effect transistors (FET) or p-channel field effect transistors. In addition, a connection relationship of the thin film transistors TR1 and T2, the capacitor Cst, and the organic light emitting diode (OLED) may be changed.

The thin film encapsulation layer 130 covering the organic light emitting element 120 may prevent oxygen and moisture from the outside from flowing into the organic light emitting element 120, thus protecting the organic light emitting element 120.

The lower passivation film 200 contacts the flexible substrate 110 of the organic light emitting display panel 100, and includes a plurality of stress adjustment patterns 20 formed in a direction opposite to where it contacts the flexible substrate 110.

The stress adjustment patterns 20 include plane stress adjustment patterns 21 formed at a position corresponding to the plane portion A, and bending stress adjustment patterns 22 formed at a position corresponding to the bending portions B.

An interval between the stress adjustment patterns 20 may be adjusted to adjust a strain of the organic light emitting display panel 100, thereby reducing stress of the bending portions B. That is, a bending interval P2 between the bending stress adjustment patterns 22 is formed to be smaller than a plane interval P1 between the plane stress adjustment patterns 21.

Specifically, the plane interval P1 or the bending interval P2 is an interval between central apexes 220a of upper ends of the stress adjustment patterns 20. The stress adjustment patterns of the organic light emitting diode display according to the first exemplary embodiment of the present invention have a prism shape as shown in FIG. 1. Accordingly, a cross-section thereof may have a triangle shape, and adjacent lower ends 220b of the stress adjustment patterns 20 having the triangle shape are directly connected to each other. The interval between the stress adjustment patterns 20 having the triangle shape is an interval between apexes 220a having the triangle shape.

As described above, stress of the bending portions of the organic light emitting display panel may be minimized by reducing the bending interval P2 between the bending stress adjustment patterns 22 attached to a position corresponding to the bending portions B of the organic light emitting display panel 100. Therefore, asymmetry of strains of the bending portions of the organic light emitting display panel may be prevented thereby removing a picture abnormality.

The lower passivation film 200 according to an exemplary embodiment of the present invention includes a polymer resin 10 and an antistatic agent 12.

The polymer resin 10 as a supporter made of a polymer material may include any one selected from UV epoxy-based materials, urethane acrylate-based materials, and acrylate-based materials.

The antistatic agent 12 may be made of a conductive material, and may include a conductive polymer, carbon black, a metal powder, a metal salt, carbon nanotubes, graphene, or combinations thereof, and preferably, carbon nanotubes or graphene.

The antistatic agent 12 may have a particle shape such as a powder and may be uniformly distributed in the polymer resin 10.

The antistatic agent 12 removes static electricity generated in the lower passivation film 200 to prevent the static electricity from flowing into the organic light emitting display panel 100 formed on the lower passivation film 200. Accordingly, a static electricity defect of the panel may be prevented without formation of a separate antistatic layer on the lower passivation film 200.

The antistatic agent 12 may be included at about 2% to 10% by weight with respect to a total weight of the polymer resin 10 and the antistatic agent 12. When the antistatic agent 12 is included within this range, sheet resistance of the lower passivation film 200 may be maintained at less than $10^9 \Omega$, and by maintaining the sheet resistance of this range, damage to the organic light emitting display panel 100 formed on the lower passivation film 200 caused by the static electricity may be prevented. As the sheet resistance is decreased, the lower passivation film 200 becomes better; however the flexibility of the lower passivation film 200 may be decreased in a case that an additional ratio of the antistatic agent 12 is very high, so it is preferable that the sheet resistance is in the range of $10^6 \Omega$ to $10^9 \Omega$.

The lower passivation film 200 according to an exemplary embodiment of the present invention may further include an inorganic fiber material 11 randomly dispersed at the polymer resin 10.

The inorganic fiber material 11 has a long bar shape in one direction, a tube shape that is hollow or filled, or a plate shape. The inorganic fiber material 11 has a longer length than a thickness of the lower passivation film 200, and the length may be in a range of about 50 to about 500 μm.

The inorganic fiber material 11 may include a glass fiber.

By randomly dispersing the inorganic fiber material 11 in the polymer resin 10, the shape deformation of the lower passivation film 200 may be prevented, and particularly, by preventing the plane contraction generated by heat, the lower passivation film 200 may be prevented from being bent by the heat. Also, the inorganic fiber material 11 may absorb a mechanical force applied from the outside or may transmit it to other layers. Accordingly, damage caused by a force applied from the outside may be prevented.

The inorganic fiber material 11 may be included at about 20% to about 40% by weight with respect to the total weight of the polymer resin 10, the inorganic fiber material 11, and the antistatic agent 12, and when in this range, contraction caused by heat may be prevented, mechanical strength is increased, and simultaneously the flexible characteristics may be maintained.

As described above, the lower passivation film 200 having the stress adjustment patterns 20 may be attached to the bottom of the organic light emitting display panel 100 to prevent physical damage to the flexible substrate 110 of the organic light emitting display panel 100 and simultaneously minimize stress of the bending portions B of the organic light emitting display panel 100. Accordingly, asymmetry of strains of the bending portions B may be prevented to eliminate picture abnormality.

A shape change prevention layer 300 for preventing a shape change of the stress adjustment pattern 20 may be attached to the bottom of the lower passivation film 200.

Figure 3:
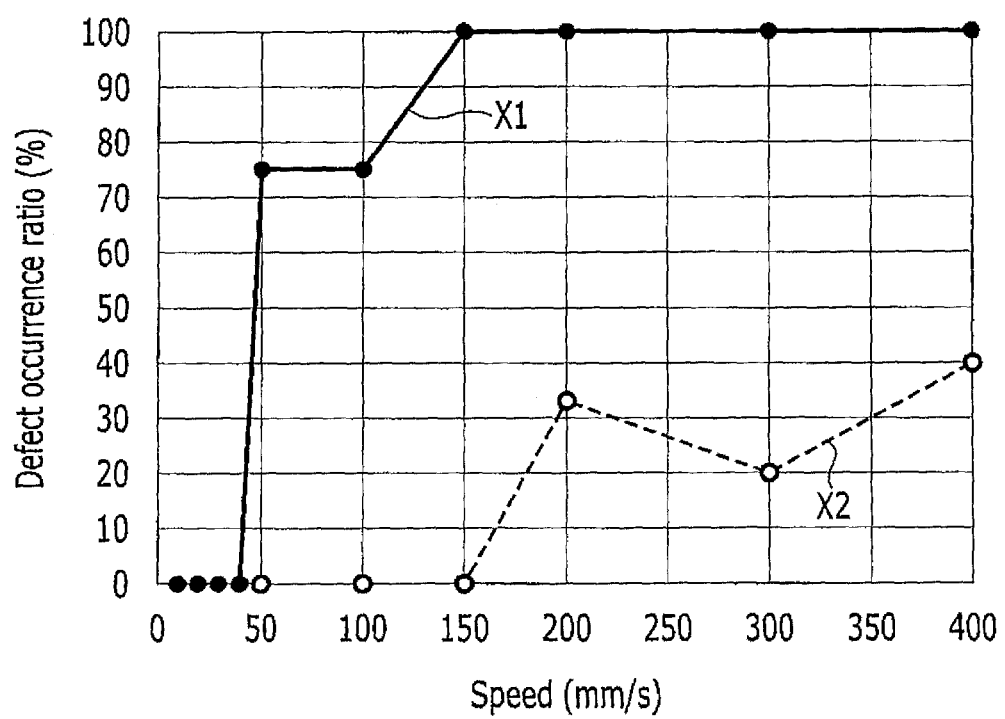
FIG. 3 is a graph of a defect occurrence ratio according to a bending speed of the organic light emitting diode display according to the first exemplary embodiment of the present invention and a known organic light emitting diode display.

FIG. 3 is a graph of a defect occurrence ratio according to bending speed of the organic light emitting diode display according to the first exemplary embodiment of the present invention and a known organic light emitting diode display.

The defect occurrence ratio of FIG. 3 means a ratio of occurrence of a problem in image quality when ten organic light emitting diode displays are bent to have a curvature radius of 3 mm. When the ten organic light emitting diode displays are bent and an abnormality occurs in one organic light emitting diode display, the defect occurrence ratio has a value of 10%. The speed of FIG. 3 means the degree of speediness of bending of the organic light emitting diode display. As the organic light emitting diode display is quickly bent, large force is applied to damage the organic light emitting diode display.

As shown in FIG. 3, it can be seen that in the known organic light emitting diode display X1, as the bending speed is increased, the defect occurrence ratio is rapidly increased, and 100% defects occur at the speed of 150 mm/s or more. However, it can be seen that in the organic light emitting diode display X2 according to the first exemplary embodiment of the present invention, even when the bending speed is 150 mm/s or more, a defect occurrence ratio of 40% or less is maintained. As described above, it can be seen that even though the organic light emitting diode display X2 according to the first exemplary embodiment of the present invention is bent at a higher speed compared to the known organic light emitting diode display X1, the defect occurrence ratio is reduced.

A method of manufacturing the organic light emitting diode display according to the first exemplary embodiment of the present invention will now be described below in detail with reference to FIGS. 4 to 6.

Figure 4:
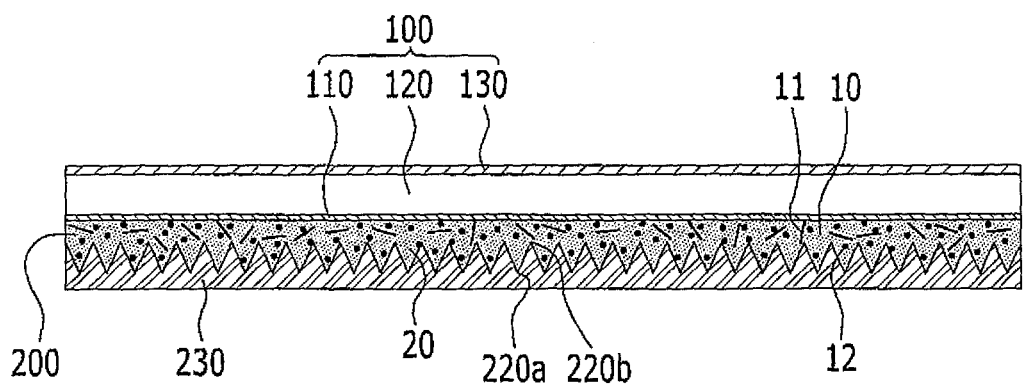
FIG. 4 to FIG. 6 are views sequentially showing a method of manufacturing the organic light emitting diode display according to the first exemplary embodiment of the present invention.
Figure 5:
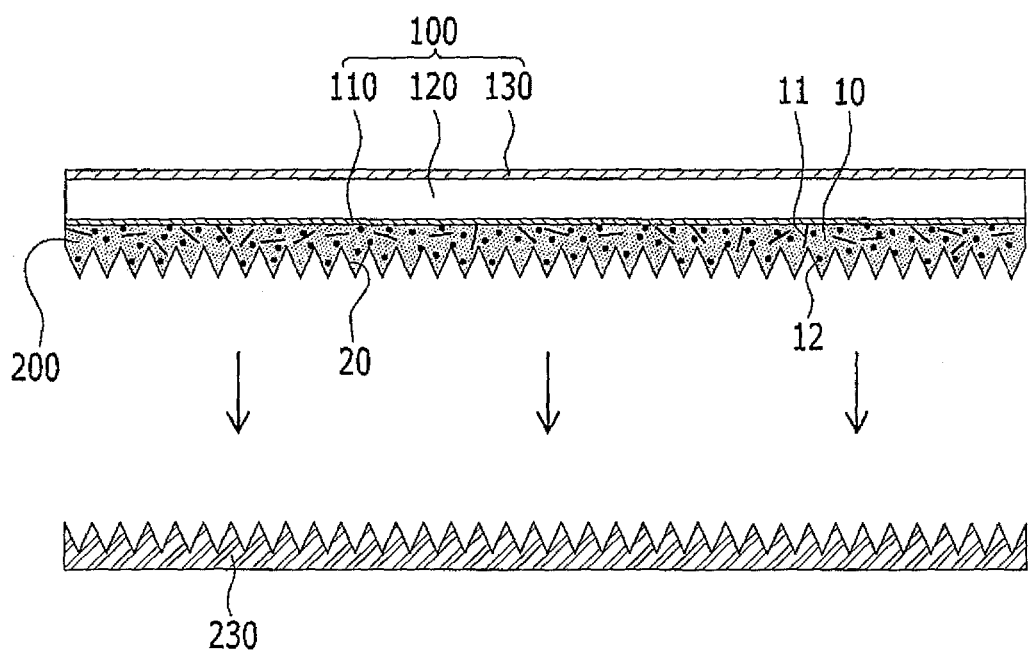
Figure 6:
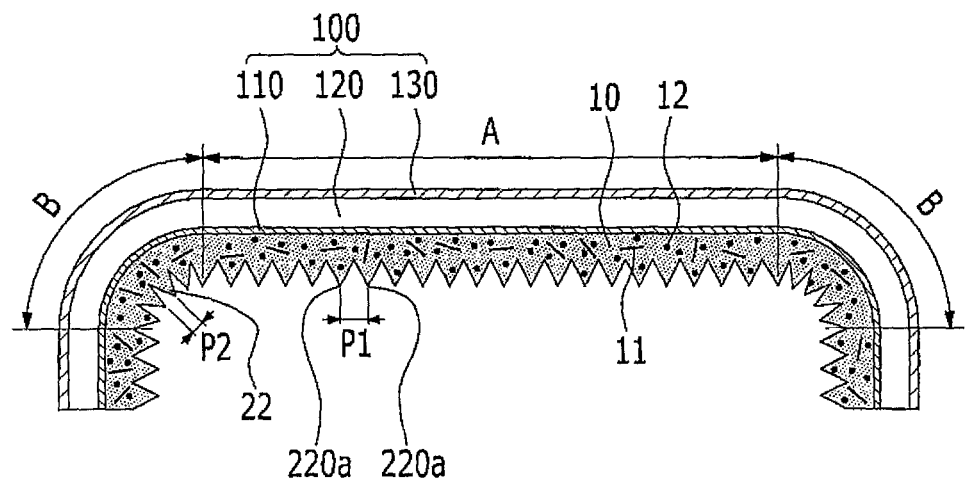

FIG. 4 to FIG. 6 are views sequentially showing the method of manufacturing the organic light emitting diode display according to the first exemplary embodiment of the present invention.

Firstly, as shown in FIG. 4, the lower passivation film 200 including the polymer resin 10 and the antistatic agent 12 is manufactured.

The polymer resin 10 as a supporter made of a polymer material may include any one selected from UV epoxy-based materials, urethane acrylate-based materials, and acrylate-based materials.

The antistatic agent 12 may be made of a conductive material, and may include a conductive polymer, carbon black, a metal powder, a metal salt, carbon nanotubes, graphene, or combinations thereof, and preferably, carbon nanotubes or graphene.

The antistatic agent 12 may have a particle shape such as a powder and may be uniformly distributed at the polymer resin 10. The antistatic agent 12 may be included at about 2% to about 10% by weight for the total content of the polymer resin 10 and the antistatic agent 12.

The lower passivation film 200 may further include the inorganic fiber material 11 randomly dispersed at the polymer resin 10.

The inorganic fiber material 11 has a long bar shape in one direction, a tube shape that is hollow or filled, or a plate shape. The inorganic fiber material 11 has a longer length than a thickness of the lower passivation film 200, and the length may be in a range of about 50 to about 500 μm.

The inorganic fiber material 11 may include a glass fiber.

The inorganic fiber material 11 may be included at about 20% to about 40% by weight of the total content of the polymer resin 10, the inorganic fiber material 11, and the antistatic agent 12.

The lower passivation film 200 includes a release film 230 covering the plurality of stress adjustment patterns 20 and including patterns matching the stress adjustment patterns 20. The plurality of stress adjustment patterns 20 and the matching patterns are disposed to be adjacent to each other.

The lower passivation film 200 is attached to the bottom of the flexible substrate 110. Further, the organic light emitting element 120 and the thin film encapsulation layer 130 are sequentially formed on the flexible substrate 110 to complete the organic light emitting display panel 100.

As described above, the stress adjustment pattern 20 is covered with the release film 230 to flatten the lower passivation film 200 while the stress adjustment pattern 20 of the lower passivation film is not first exposed, thus completing the organic light emitting display panel 100. Thereby, a reduction in recognition ratio of an alignment mark due to optical scattering by the stress adjustment patterns 20 of the lower passivation film 200 may be prevented during the manufacturing process.

Further, when the chip on film (COF) is pressed on the organic light emitting display panel 100 while the stress adjustment pattern 20 of the lower passivation film 200 is exposed, pressing force may be reduced to increase a frequency of occurrence of pressing defects. However, pressing force may be prevented from being reduced and the frequency of occurrence of pressing defects may be reduced when pressing the chip on film (COF) on the organic light emitting display panel 100 while the stress adjustment pattern 20 is covered with the release film 230 to flatten the lower passivation film 200 in accordance with the method of manufacturing the organic light emitting diode display according to the first exemplary embodiment of the present invention.

Next, as shown in FIG. 5, the release film 230 is separated from the lower passivation film 200 to expose the stress adjustment pattern 20. In this case, a space is formed between the adjacent stress adjustment patterns 20.

Next, as shown in FIG. 6, a portion of the organic light emitting display panel 100 is bent to form the bending portion B. In this case, the space between the bending stress adjustment patterns 22 formed at a position corresponding to the bending portion B is reduced.

Accordingly, the bending interval P2 between the bending stress adjustment patterns 22 formed at a position corresponding to the bending portion B is smaller than the plane interval P1 between the plane stress adjustment patterns 21 formed to a position corresponding to the plane portion A of the organic light emitting display panel 100. In this case, the plane interval P1 or the bending interval P2 may be an interval between the central axes 220a of the upper ends of the stress adjustment patterns 20.

The lower ends of the adjacent stress adjustment patterns having the triangle shape are directly connected to each other in the first exemplary embodiment. However, a second exemplary embodiment is also feasible, in which the lower ends of the adjacent stress adjustment patterns having the triangle shape are connected while being spaced apart from each other by a predetermined interval.

Hereinafter, the organic light emitting diode display according to the second exemplary embodiment of the present invention will be described in detail with reference to FIG. 7.

Figure 7:
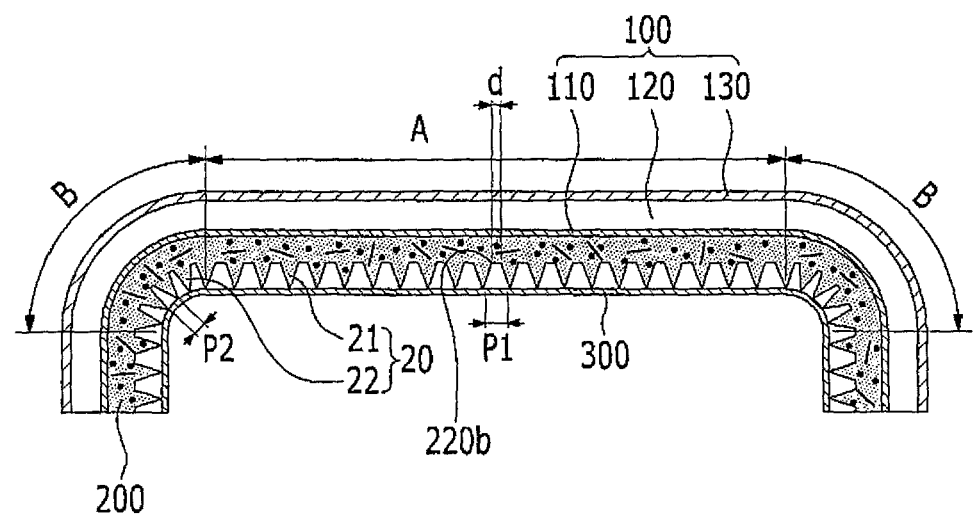
FIG. 7 is a lateral view of an organic light emitting diode display according to a second exemplary embodiment of the present invention.

FIG. 7 is a lateral view of the organic light emitting diode display according to the second exemplary embodiment of the present invention.

The second exemplary embodiment is substantially the same as the first exemplary embodiment shown in FIGS. 1 and 2 with the exception of the interval between the lower ends of the stress adjustment patterns of the lower passivation film, and thus a repeated description thereof will be omitted.

As shown in FIG. 7, the stress adjustment patterns 20 of the organic light emitting diode display according to the second exemplary embodiment of the present invention have the triangle shape. The lower ends 220b of the adjacent stress adjustment patterns 20 having the triangle shape are connected while being spaced apart from each other by a predetermined interval d. In the stress adjustment patterns 20 having the aforementioned shape, stress occurring in the bending portion B may be further minimized.

The stress adjustment patterns having the triangle shape are formed in the first exemplary embodiment. However, third and fourth exemplary embodiments are also feasible, in which stress adjustment patterns having a trapezoid shape are formed.

Hereinafter, the organic light emitting diode displays according to the third and fourth exemplary embodiments of the present invention will be described in detail with reference to FIG. 8 and FIG. 9.

Figure 8:
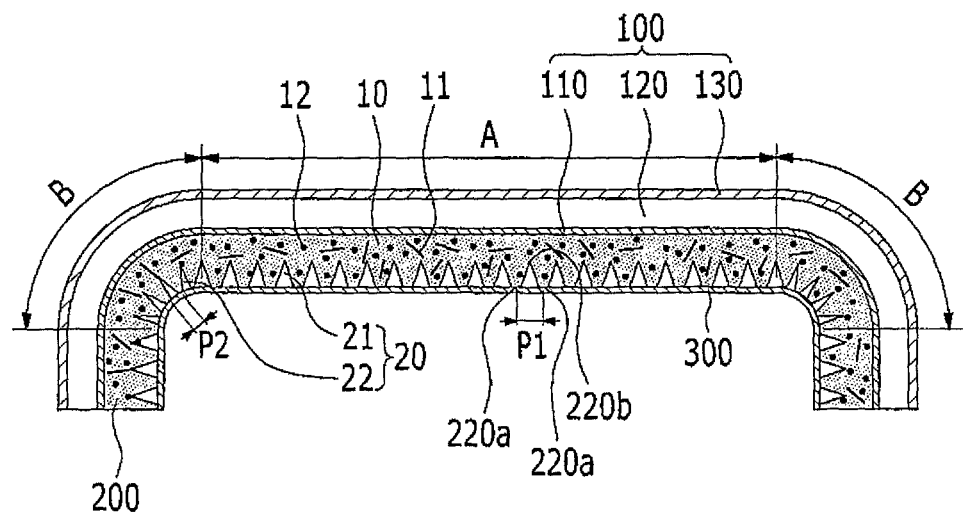
FIG. 8 is a lateral view of an organic light emitting diode display according to a third exemplary embodiment of the present invention.
Figure 9:
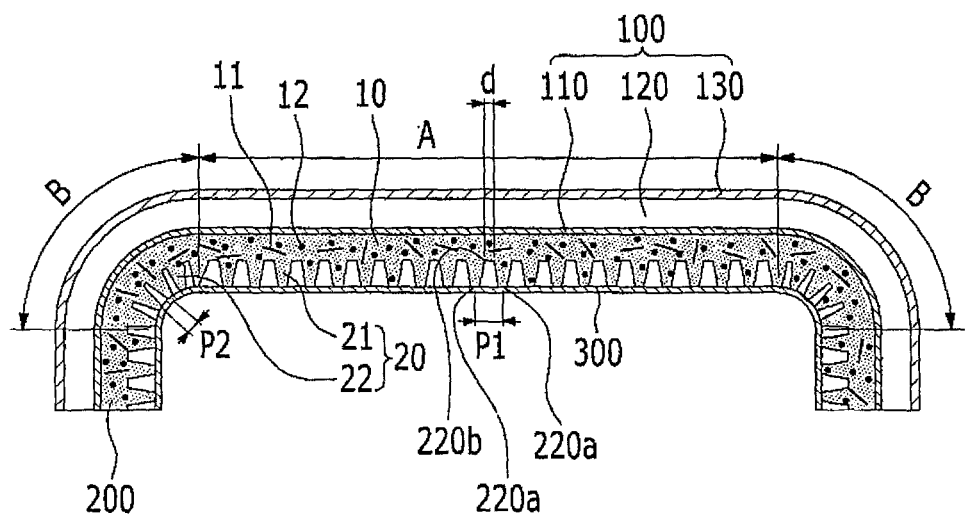
FIG. 9 is a lateral view of an organic light emitting diode display according to a fourth exemplary embodiment of the present invention.

FIG. 8 is a lateral view of the organic light emitting diode display according to the third exemplary embodiment of the present invention, and FIG. 9 is a lateral view of the organic light emitting diode display according to the fourth exemplary embodiment of the present invention.

The third and fourth exemplary embodiments are substantially the same as the first and the second exemplary embodiments shown in FIGS. 1 and 7 with the exception of the shapes of the stress adjustment patterns of the lower passivation film, and thus a repeated description thereof will be omitted.

First, as shown in FIG. 8, the stress adjustment patterns 20 of the organic light emitting diode display according to the third exemplary embodiment of the present invention have the trapezoid shape, and the lower ends 220b of the adjacent stress adjustment patterns 20 having the trapezoid shape are directly connected to each other. The intervals P1 and P2 between the stress adjustment patterns 20 having the trapezoid shape are intervals between the central axes 220a of the upper ends of the trapezoid shapes.

Further, as shown in FIG. 9, the stress adjustment patterns 20 of the organic light emitting diode display according to the fourth exemplary embodiment of the present invention have the trapezoid shape. The lower ends 220b of the adjacent stress adjustment patterns 20 having the trapezoid shape are connected while being spaced apart from each other by a predetermined interval d. The intervals P1 and P2 between the stress adjustment patterns 20 having the trapezoid shape are intervals between the central axes 220a of the upper ends of the trapezoid shapes.

In the stress adjustment patterns 20 having the trapezoid shape shown in FIGS. 8 and 9, stress occurring in the bending portion B may be further minimized compared to the stress adjustment patterns 20 having the triangle shape shown in FIGS. 1 and 7.

Figure 10:
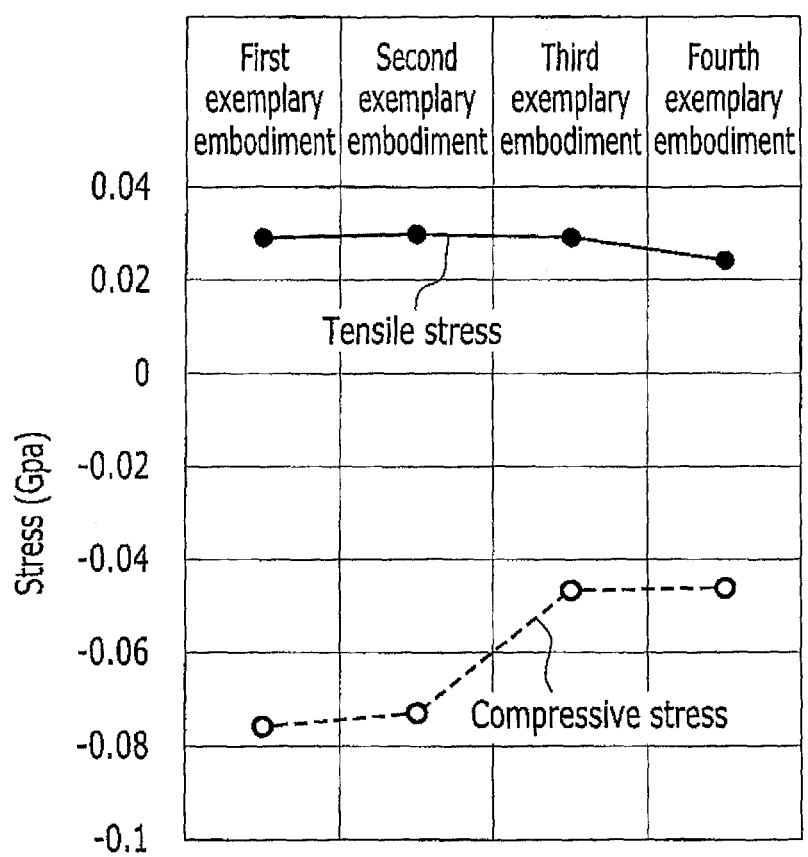
FIG. 10 is a graph showing a comparison of stresses of the organic light emitting diode displays according to the first to fourth exemplary embodiments of the present invention.

FIG. 10 is a graph showing comparison of stresses of the organic light emitting diode displays according to the first to fourth exemplary embodiments of the present invention.

As shown in FIG. 10, it can be seen that tensile stress and compressive stress of the third and fourth exemplary embodiments including the stress adjustment patterns having the trapezoid shape are reduced compared to the first and second exemplary embodiments including the stress adjustment patterns having the triangle shape.

Further, it can be seen that tensile stress and compressive stress of the second exemplary embodiment where the lower ends of the stress adjustment patterns are connected while being spaced apart from each other by a predetermined interval are reduced compared to the first exemplary embodiment where the lower ends of the stress adjustment patterns are directly connected. In addition, it can be seen that tensile stress and compressive stress of the fourth exemplary embodiment where the lower ends of the stress adjustment patterns are connected while being spaced apart from each other by a predetermined interval are reduced compared to the third exemplary embodiment where the lower ends of the stress adjustment patterns are directly connected.

The stress adjustment patterns having the triangle shape are formed in the first exemplary embodiment. However, a fifth exemplary embodiment is also feasible, in which the stress adjustment patterns having the semicircle shape are formed.

Hereinafter, the organic light emitting diode display according to the fifth exemplary embodiment of the present invention will be described in detail with reference to FIG. 11.

Figure 11:
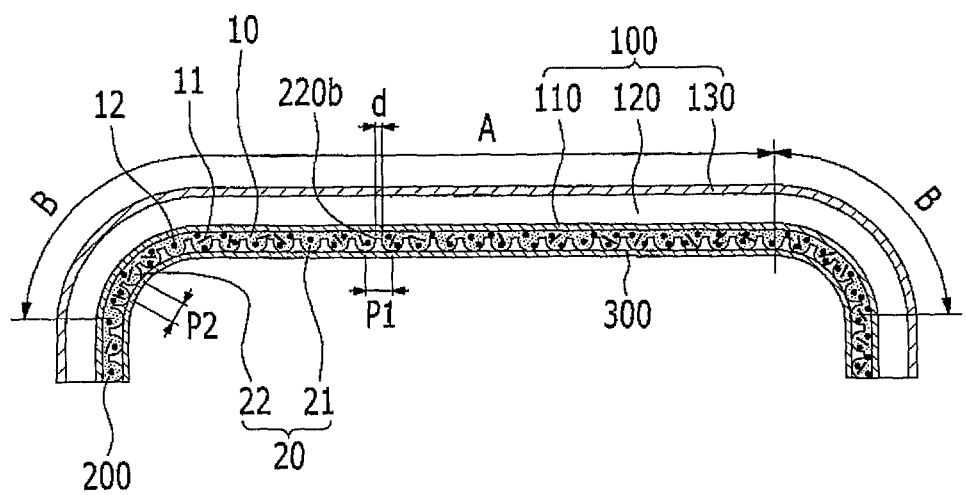
FIG. 11 is a lateral view of the organic light emitting diode display according to a fifth exemplary embodiment of the present invention.

FIG. 11 is a lateral view of the organic light emitting diode display according to the fifth exemplary embodiment of the present invention.

The fifth exemplary embodiment is substantially the same as the first exemplary embodiment shown in FIGS. 1 and 2 with the exception of the shapes of the stress adjustment patterns of the lower passivation film, and thus a repeated description thereof will be omitted.

As shown in FIG. 11, the stress adjustment patterns 20 of the organic light emitting diode display according to the fifth exemplary embodiment of the present invention have a semicircle shape. The lower ends 220b of the adjacent stress adjustment patterns 20 having the semicircle shape are connected while being spaced apart from each other by a predetermined interval d. In the stress adjustment patterns 20 having the aforementioned shape, stress occurring in the bending portion B may be further minimized.

The stress adjustment patterns are formed in the entire lower passivation film in the first exemplary embodiment. However, a sixth exemplary embodiment is also feasible, in which the stress adjustment patterns are not formed in a portion of the lower passivation film.

Hereinafter, the organic light emitting diode display according to the sixth exemplary embodiment of the present invention will be described in detail with reference to FIG. 12.

Figure 12:
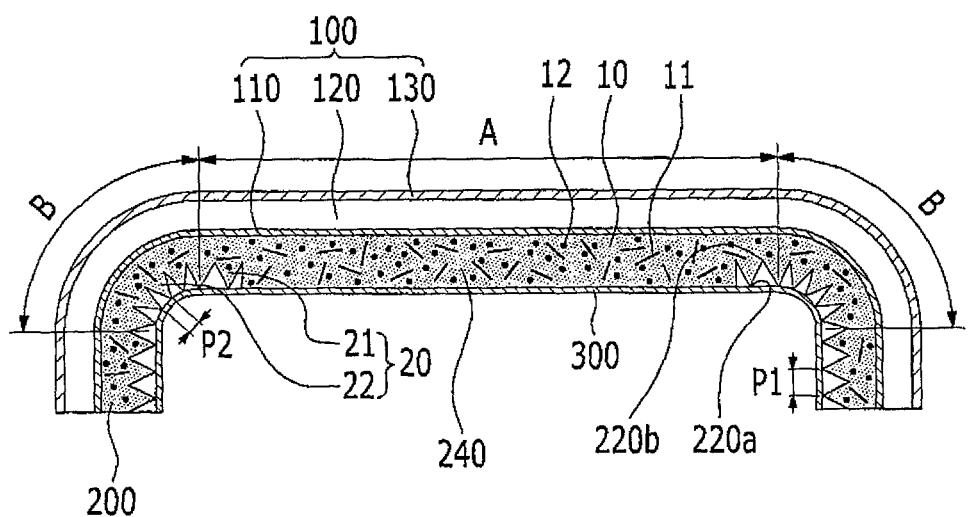
FIG. 12 is a lateral view of the organic light emitting diode display according to a sixth exemplary embodiment of the present invention.

FIG. 12 is a lateral view of the organic light emitting diode display according to the sixth exemplary embodiment of the present invention.

The sixth exemplary embodiment is substantially the same as the first exemplary embodiment shown in FIGS. 1 and 2 with the exception of the stress adjustment patterns of the lower passivation film, and thus a repeated description thereof will be omitted.

As shown in FIG. 12, the lower passivation film 200 of the organic light emitting diode display according to the sixth exemplary embodiment of the present invention is in contact with the flexible substrate 110 of the organic light emitting display panel 100 and includes a stress adjustment layer (or stress adjustment patterns) 20 formed in a direction opposite to the surface with which that the flexible substrate 110 is contacted and has a plane passivation layer 240.

The stress adjustment patterns 20 include the plane stress adjustment patterns 21 formed at a position corresponding to the plane portion A, and the bending stress adjustment patterns 22 formed at a position corresponding to the bending portions B. The interval between the stress adjustment patterns 20 may be adjusted to adjust a strain of the organic light emitting display panel 100, thereby reducing stress of the bending portions B. That is, the bending interval P2 between the bending stress adjustment patterns 22 is formed to be smaller than the plane interval P1 between the plane stress adjustment patterns 21.

In this case, the plane passivation layer 240 is formed at most positions corresponding to the plane portion A that is not bent, and the bending stress adjustment pattern 22 is formed only at a position corresponding to the bending portion B. Accordingly, the lower passivation film 200 protecting the organic light emitting display panel 100 from the outside may sufficiently function.

As described above, the organic light emitting diode display according to an exemplary embodiment of the present invention decreases the bending interval between the bending stress adjustment patterns formed at the lower passivation film processed with the antistatic agent and attached at the position corresponding to the bending portion of the organic light emitting panel, thereby selectively minimizing the stress of the bending portion of the organic light emitting panel. Therefore, asymmetry of strains of the bending portions of the organic light emitting display panel can be prevented to eliminate a picture abnormality, and the static electricity may be prevented.

Further, a stress adjustment pattern is covered with a release film to flatten the lower passivation film while the stress adjustment pattern of the lower passivation film is not first exposed, thus completing the organic light emitting display panel. Thereby, it is possible to prevent a reduction in recognition ratio of an alignment mark due to optical scattering by the stress adjustment patterns of the lower passivation film during a manufacturing process.

Further, when a chip on film (COF) is pressed on the organic light emitting display panel while the stress adjustment pattern of the lower passivation film is exposed, pressing force may be reduced to increase a frequency of occurrence of pressing defects. However, it is possible to prevent a reduction in pressing force and reduce a frequency of occurrence of pressing defects by pressing the chip on film (COF) on the organic light emitting display panel while the stress adjustment pattern is covered with the release film to flatten the lower passivation film.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 100: organic light emitting panel | 200: lower passivation film |
| 240: plane passivation layer | 10: polymer resin |
| 11: inorganic fiber material | 12: antistatic agent |

What is claimed is:

1. An organic light emitting diode display comprising:
an organic light emitting display panel for displaying an image, the organic light emitting display panel including:
a flexible substrate;
an organic light emitting element formed on the flexible substrate; and
a thin film encapsulation layer covering the organic light emitting element; and
a lower passivation film attached to the flexible substrate of the organic light emitting panel and including a polymer resin and an antistatic agent,
wherein the lower passivation film includes a plurality of stress adjustment patterns disposed adjacent to each other.

2. The display of claim 1, wherein
the polymer resin includes at least one selected from a group including a UV epoxy-based material, a urethane acrylate-based material, and an acrylate-based material.

3. The display of claim 1, wherein
the antistatic agent includes at least one selected from a group including a conductive polymer, carbon black, a metal powder, a metal salt, carbon nanotubes, and graphene.

4. The display of claim 1, wherein
the antistatic agent is in a range of about 2% to about 10% of a total weight of the polymer resin and the antistatic agent.

5. The display of claim 1, wherein
the stress adjustment patterns have a triangle shape, a trapezoid shape, or a semi-circle shape.

6. The organic light emitting diode display of claim 1, wherein
ends of adjacent ones of the stress adjustment patterns are adjacent to and coincident with each other.

7. The display of claim 1, wherein
ends of adjacent ones of the stress adjustment patterns are adjacent to and separated from each other.

8. An organic light emitting diode display comprising:
an organic light emitting display panel for displaying an image; and
a lower passivation film attached to a bottom of the organic light emitting panel and including a polymer resin, an antistatic agent, and an inorganic fiber material,
wherein the lower passivation film further includes a plurality of stress adjustment patterns arranged adjacent to each other.

9. The display of claim 8, wherein
the inorganic fiber material is in a range of about 20% to about 40% of a total weight of the polymer resin, the antistatic agent, and the inorganic fiber material.

10. An organic light emitting diode display comprising:
an organic light emitting display panel for displaying an image, and having a flat plane portion and a curved bending portion positioned at an end of the plane portion; and
a lower passivation film attached to a bottom of the organic light emitting panel and including a polymer resin and an antistatic agent,
wherein the lower passivation film includes a plurality of stress adjustment patterns disposed adjacent to each other.

11. The display of claim 10, wherein
the stress adjustment patterns include plane stress adjustment patterns at positions corresponding to the flat plane portion and bending stress adjustment patterns at positions corresponding to the bending portion, and
an interval between adjacent ones of the bending stress adjustment patterns is smaller than an interval between adjacent ones of the plane stress adjustment patterns.

12. The display of claim 11, wherein
the interval between the bending stress adjustment patterns and/or the interval between the plane stress adjustment patterns extends between center axes of upper ends of the respective stress adjustment patterns.

13. The display of claim 10, wherein
the lower passivation film is formed under the plane portion, and further includes a plane protection portion adjacent to the stress adjustment patterns.

14. The display of claim 13, wherein
the plane protection portion is formed at a position corresponding to the plane portion.

* * * * *